US006667895B2

(12) United States Patent
Jang et al.

(10) Patent No.: US 6,667,895 B2
(45) Date of Patent: Dec. 23, 2003

(54) INTEGRATED CIRCUIT DEVICE AND MODULE WITH INTEGRATED CIRCUITS

(75) Inventors: Seong-Jin Jang, Kyunggi-do (KR); Young-Hyun Jun, Seoul (KR); Chang-Man Khang, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/192,901

(22) Filed: Jul. 10, 2002

(65) Prior Publication Data

US 2003/0107908 A1 Jun. 12, 2003

(30) Foreign Application Priority Data

Dec. 6, 2001 (KR) ........................................ 2001-76944

(51) Int. Cl.7 .................................................. G11C 5/06

(52) U.S. Cl. ...................... 365/63; 365/51; 365/189.02; 365/189.07; 257/737

(58) Field of Search ....................... 365/63, 51, 189.02, 365/189.05, 189.07; 257/737, 778, 738, 693

(56) References Cited

U.S. PATENT DOCUMENTS

| | | | | |
|---|---|---|---|---|
| 5,691,570 A | | 11/1997 | Kozuka | |
| 5,889,327 A | | 3/1999 | Washida et al. | |
| 5,898,636 A | * | 4/1999 | Isomura et al. | 365/230.03 |
| 6,163,459 A | * | 12/2000 | Terada et al. | 361/736 |
| 6,307,769 B1 | | 10/2001 | Nuxoll et al. | |
| 6,370,054 B1 | * | 4/2002 | Fujisawa et al. | 365/63 |

FOREIGN PATENT DOCUMENTS

| | | |
|---|---|---|
| JP | 2000-340737 | 12/2000 |

* cited by examiner

*Primary Examiner*—Son T. Dinh
(74) *Attorney, Agent, or Firm*—Marger Johnson & McCollom, P.C.

(57) ABSTRACT

An integrated circuit comprises a substrate having circuitry integrated with the substrate. Switching circuitry is selectably operable to configure signal paths to alternative mirrored pads over the substrate. At least one of the first and second signal paths may comprise a buffer in series between the switching circuit and its respective pad.

31 Claims, 11 Drawing Sheets

850 110(B) 840 A2 A10 /RAS CK /CK /CS A9 A5 MUX 470 SEL BUF A2 818 A10 816 /RAS 814 CK 812 /CK 810 /CS 808 A9 806 A5 804 820

850' 110(B) 818 A5 816 A9 814 /CS 812 /CK 810 CK 808 /RAS 806 A10 804 A2 BUF 840 MUX A2 A10 /RAS CK /CK /CS A9 A5 470 SEL' 820

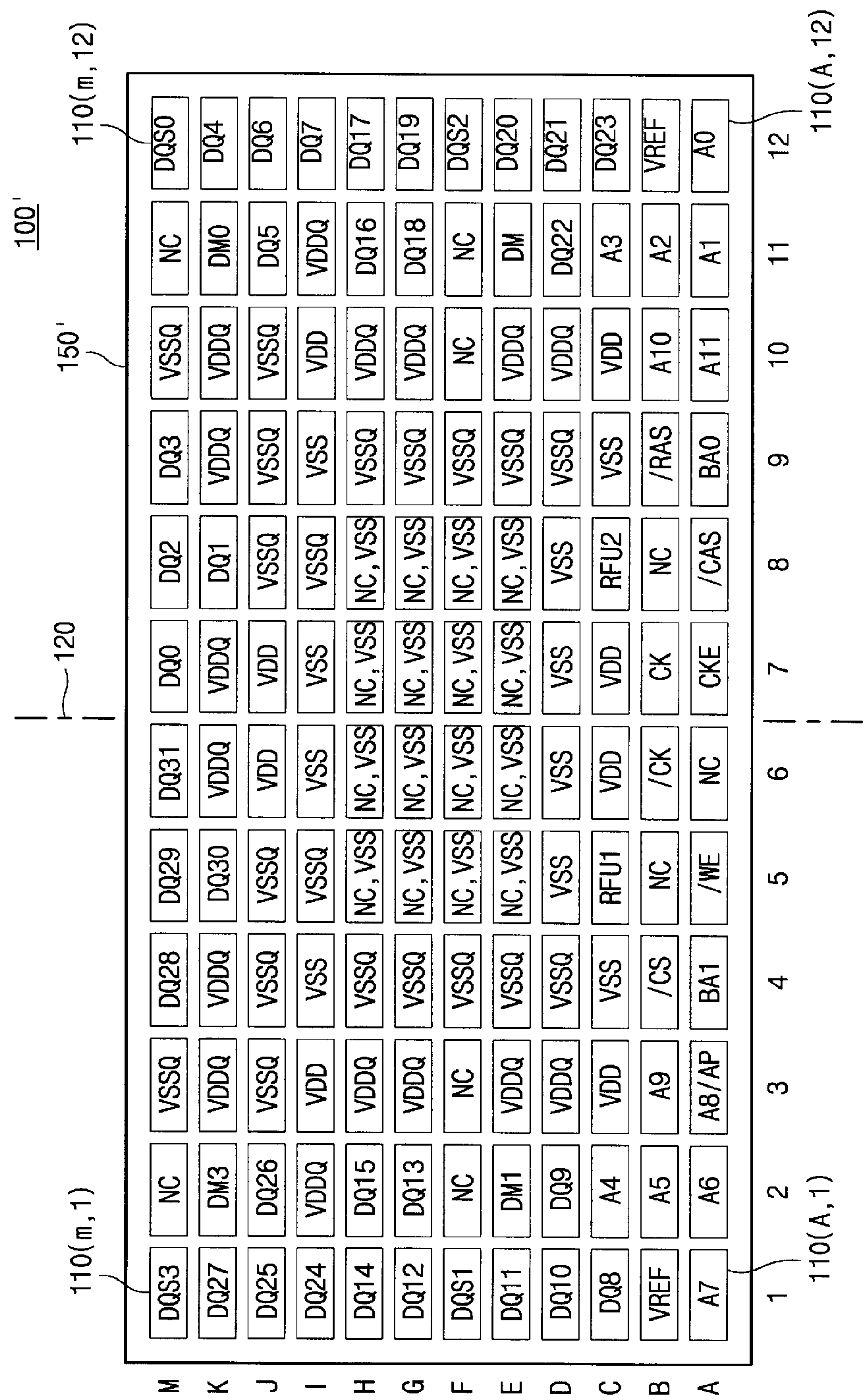
Fig. 2
100'
150'
120
110(m,1)
110(m,12)
110(A,1)
110(A,12)
M K J I H G F E D C B A
1 2 3 4 5 6 7 8 9 10 11 12
DQS3 NC VSSQ DQ28 DQ29 DQ31 DQ0 DQ2 DQ3 VSSQ NC DQS0
DQ27 DM3 VDDQ VDDQ DQ30 VDDQ VDDQ DQ1 VDDQ VDDQ DM0 DQ4
DQ25 DQ26 VSSQ VSSQ VSSQ VDD VDD VSSQ VSSQ VSSQ DQ5 DQ6
DQ24 VDDQ VDD VSS VSSQ VSS VSS VSSQ VSS VDD VDDQ DQ7
DQ14 DQ15 VDDQ VSSQ NC,VSS NC,VSS NC,VSS NC,VSS VSSQ VDDQ DQ16 DQ17
DQ12 DQ13 VDDQ VSSQ NC,VSS NC,VSS NC,VSS NC,VSS VSSQ VDDQ DQ18 DQ19
DQS1 NC NC VSSQ NC,VSS NC,VSS NC,VSS NC,VSS VSSQ NC NC DQS2
DQ11 DM1 VDDQ VSSQ NC,VSS NC,VSS NC,VSS NC,VSS VSSQ VDDQ DM DQ20
DQ10 DQ9 VDDQ VSSQ VSS VSS VSS VSS VSSQ VDDQ DQ22 DQ21
DQ8 A4 VDD VSS RFU1 VDD VDD RFU2 VSS VDD A3 DQ23
VREF A5 A9 /CS NC /CK CK NC /RAS A10 A2 VREF
A7 A6 A8/AP BA1 /WE NC CKE /CAS BA0 A11 A1 A0

510
110(A,1)
520
110(A,12)
110(k,5)
533
110(k,8)
430
440
150'
310(124)
310(90)
310(8)
310(38)
150
100'
100
310(90)
310(124)
310(38)
310(8)
440
430
110(A,12)
110(A,1)
110(k,8)
531
110(k,5)
524
522
530
532
540
A0
A7
DQ1
DQ7
Memory
Controller 110(B)
850'
840
MUX
470
SEL'
A2
A10
/RAS
CK
/CK
/CS
A9
A5
BUF
820
818
816
814
812
810
808
806
804
110(B)
850
840
MUX
470
SEL 900
920
Processor
940
510
150'
150
Memory
Module
540
Memory
Controller
960
Keyboard
Printer
Mouse
Peripheral
ETC.

INTEGRATED CIRCUIT DEVICE AND MODULE WITH INTEGRATED CIRCUITS

This application claims benefit and priority of Korean Patent Application No. 2001-76944, filed Dec. 6, 2001.

BACKGROUND OF THE INVENTION

Conventional integrated circuits include a variety of active and passive electrical components. The active electrical components may comprise, e.g., diodes and transistors. The passive components may include, e.g., capacitors and resistors.

Integrated together upon a substrate, the electrical elements can provide combined electrical functionality. For example, the integrated elements might be used to provide memory as a dynamic random access memory (DRAM) or static random access memory (SRAM). Additionally, a plurality of such integrated memory chips may be assembled together to provide a memory module of larger capacity memory.

Most memory modules use a plurality of integrated circuits mounted on both sides of a module board, such as a printed circuit board. For example, a plurality of memory chips—such as chip scale, gull wing, flip-chip, ball grid array or other package configuration—may be mounted to opposite surfaces of the module board. The board provides the physical support to the integrated circuits. Additionally, it may electrically couple terminals of the integrated circuits and external circuits.

A dual in-line memory module (DIMM) may comprise a plurality of memory chips mounted to opposite surfaces of a printed circuit board. To simplify, a wiring layout for the module board for chips that oppose one another of the opposite sides may have pin assignments of mirrored relationship. The chips for one side of the board may have terminals (i.e., pins) of mirrored relationship relative to those of similar identity on the opposite side of the board. Such mirrored chips may be referred to as "mirrored pairs" or "mirror images."

When positioned opposite one another on opposite sides of a module board, the terminals of same identity of the two opposing chips of a mirror may be interconnected at substantially the same locations on the board. Accordingly, the board layout may be simplified and the lengths of its conductive traces may be kept short.

It may be understood that as the integrated circuit densities increase, the integrity of interconnections and signal routing may be affected. The increased densities may reduce line geometries, which in-turn may increase circuit RC settling constants and propagation delays. Regardless, manufactures continue to push for increased densities.

In addition to seeking greater densities, many manufactures strive to provide for integrated circuit devices that may achieve substantially the same propagation delays across a plurality of its interfaces—e.g., interfaces which may be associated with board-to-package transitions and internal I/O lines of the device. If the electrical delays (i.e., lengths or propagation paths) of the plurality of interfaces may be kept substantially the same, device manufactures may be able to provide devices of higher operating speeds and greater I/O capability than what might otherwise be available. This may be especially valuable for development of memory modules for multi-bit and synchronous data transfer applications.

SUMMARY

In accordance with an exemplary embodiment of the present invention, an integrated circuit device comprises a substrate having circuitry integrated together with the substrate. A switching circuit is selectably operable to configure first and second signal paths of respective first and second pads, the first and second pads of mirrored relationship about an axis of the substrate. In accordance with a select signal, the switching circuit may alternatively configure the first signal path between the first pad and one node of first and second internal nodes, and the second signal path between the second pad and the other node of the first and second internal nodes. At least one of the first and second signal paths may comprise a buffer positioned electrically in series between the switching circuit and the respective first or second pad.

In a further exemplary embodiment, the buffer may comprise a signal converter to convert signals of TTL levels to CMOS levels.

In another exemplary embodiment, the buffer may present an impedance match to a transmission path associated with the first or second pad.

In yet a further aspect of an exemplary embodiment, a plurality of the mirrored pair of first and second pads may be associated with corresponding mirrored pins of a ball grid array.

BRIEF DESCRIPTION OF THE DRAWINGS

The present disclosure may be best understood with reference to the accompanying drawings, wherein:

FIG. 2 is a schematic diagram of an underside of a ball grid array package having a mirrored pin arrangement;

DETAILED DESCRIPTION

In the following description, numerous specific details are set forth to provide an understanding of exemplary embodiments of the present invention. It will be understood, however, that alternative embodiments may comprise sub-combinations of the disclosed exemplary embodiments.

Additionally, readily established circuits may be disclosed in simplified form (e.g., block diagram style) to avoid obscuring the essence of the embodiments with excess detail. Likewise, to aid a clear and precise disclosure, the description of their operations—e.g., timing considerations and the like—may similarly be simplified when persons of ordinary skill in the art can readily understand their operations by way of the drawings and disclosure.

"Substrate" or substrate assembly as used herein may be meant to include, e.g., a die of a semiconductor wafer. Such die may have one or more layers of material that have been formed on or within a substrate. The layers may be patterned to produce devices (e.g., transistors, diodes, capacitors, interconnects, etc.) for an integration of circuitry. In forming such devices, the one or more patterned layers can result in topographies of various heights. When referencing this integration of circuitry, it may be described as being formed together, on or within the substrate and be referenced as an "integrated circuit."

As used herein, "integrated circuit" may also reference the device after further processing or fabrication for a given package configuration. The package might be of a variety of configurations—such as, for example, chip-scale, ball grid array, flip-chip, gull wing, J-lead, lead frame and the like. Additionally, the integrated circuit may be referenced by various sub-combinations of these terms—e.g., semiconductor integrated circuit device or simply chip. In other words, through additional packaging processes or fabrication, an intermediate level "integrated circuit" may become an "integrated circuit" of a higher level of realization.

The term "chip" may refer to a semiconductor die. Alternatively, it may reference a type of "chip scale package" of, for example, a flip-chip configuration. As used herein, its particular meaning will be clear in its context of use.

Figure 1:
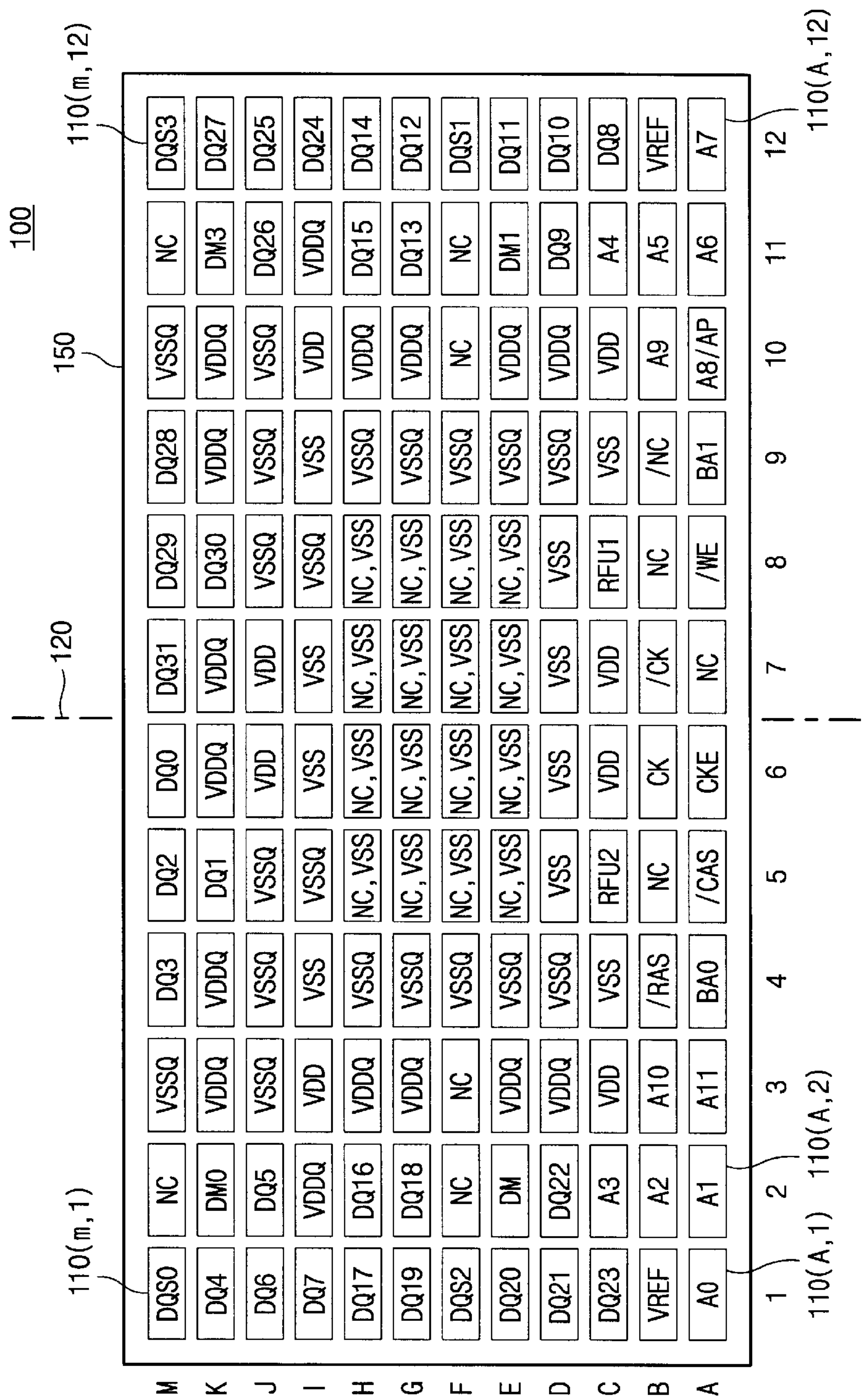
FIG. 1 is a schematic diagram of an underside of a ball grid array package having a normal pin arrangement.

With reference to FIG. 1, a ball grid array of an integrated circuit 150 comprises pins (e.g. 144 pins) 110 of various identifications of a first signal assignment arrangement 100. In FIG. 1, exemplary identifications for the pins 110 may be representative of signals to interface and operate a memory device. The pins or pads of the array may be indexed by way of a plurality of rows (A–M) and columns (1–12)—wherein, each pin/pad may be referenced by a row, column index. For example, the bottom left pin may be indexed as pin 110(A, 1); the bottom row as pins 110(A); and the fourth column as pins 110(4).

Certain pins of the array 100 may include an identification NC, see for example, pins 110(F,2–3) and 110(F,10–11). The NC identification may reference a terminal that may not be coupled internally. In the case of a lead frame style package, the NC identification may indicate the absence of a wire bond to the particular lead.

As used herein, "pins" may refer to terminals of an integrated circuit that may interface an external circuit. In the case of a ball grid array, the pins may comprise electrically conductive "balls" that are attached to pads of the integrated circuit. Alternatively, the terminals may comprise elevated or recessed conductive pads of the integrated circuit. The elevated or recessed pads may electrically connect with mating sites of, for example, a printed circuit board or other external circuit.

Referencing FIG. 2, integrated circuit 150' of a ball grid array configuration comprises pins 110 having a pin-to signal arrangement 100' that may mirror the first arrangement 100 of FIG. 1. The signals identified for the arrangement 100' mirror those of the arrangement 100. For example, pins 110(A,1) and 110(A,12) may be assigned identifications of address bits A7 and A0 respectively within the array arrangement 100' (FIG. 2); such assignments mirror the A0 and A7 assignments to the same pins in arrangement 100 (FIG. 1). Thus, address A0 signal which is transferred from memory controller is applied to address A0 pad 310(124) of FIG. 3 through the pin 110(A, 1) in the normal pin arrangement (FIG. 1). On the other hand, the address A0 signal which is transferred from memory controller is applied to address pad 310(90) of FIG. 3 through the pin 110(A, 12) in the mirror pin arrangement (FIG. 2). However, the address A0 signal which is applied to the address A7 pad 310(90) is transferred to an internal circuit for address A0 signal through switching circuit (MUX) in the mirror package.

Figure 3:
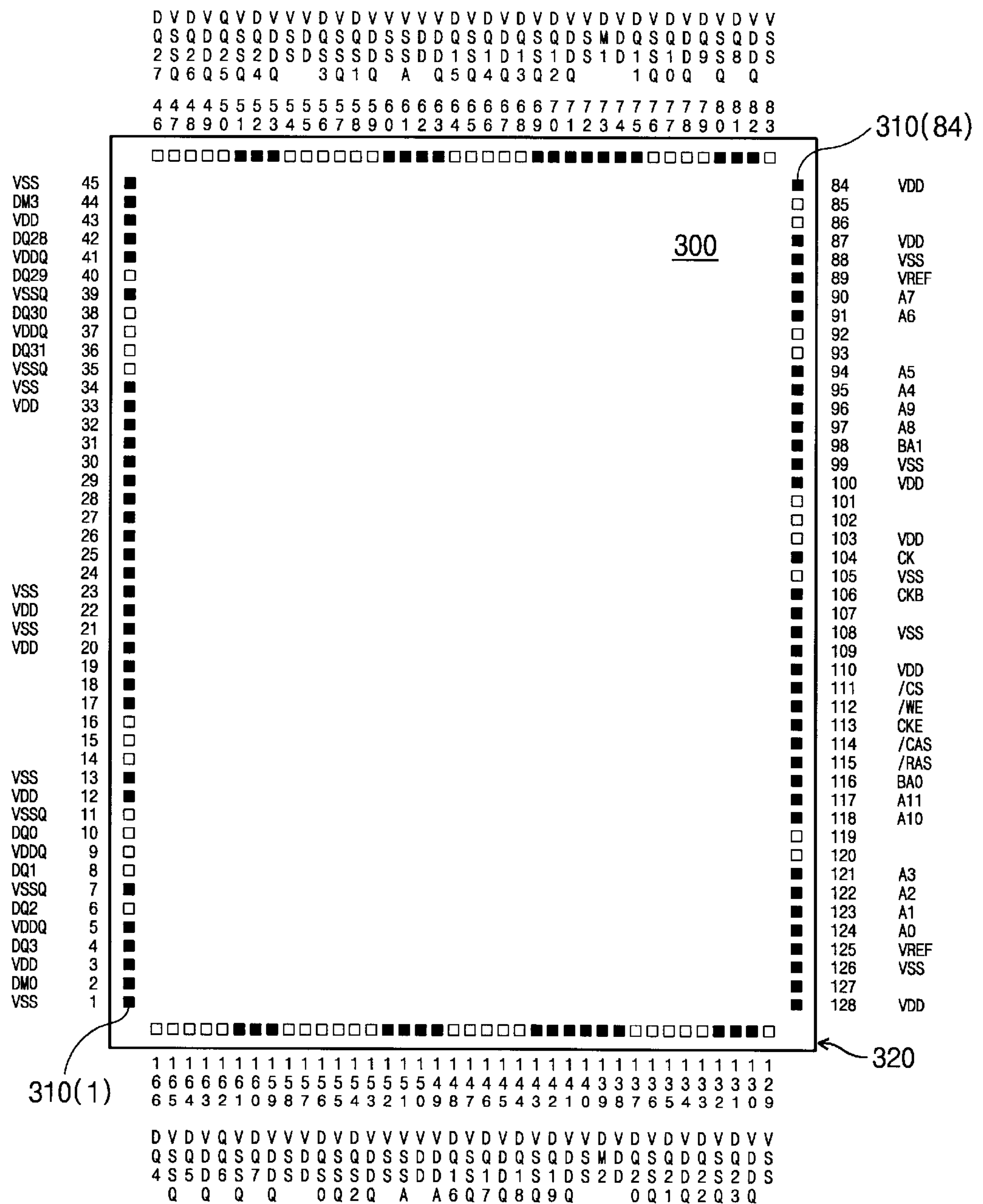
FIG. 3 is a schematic diagram of an arrangement of pads for a ball grid array for a semiconductor integrated circuit device.

Also, address A7 signal which is transferred from memory controller is applied to address pad 310(90) of FIG. 3 through the pin 110(A, 12) in the normal pin arrangement (FIG. 1). On the other hand, the address A7 signal which is transferred from memory controller is applied to address pad 310(124) of FIG. 3 through the pin 110(A, 1) in the mirror pin arrangement (FIG. 2). However, the address A7 signal which is applied to the address pad 130(124) is transferred to an internal circuit for address A7 signal through switching (MUX) in the mirror package.

In other words, both of pin 110(A, 1) of the FIG. 1 and pin 110(A, 12) of the FIG. 2 receive an external address A0 signal generated from the memory controller. However, the pin 110(A, 1) of the FIG. 1 is connected to an address to an address pad 310(124) of FIG. 3 while the pin 110(A, 12) of FIG. 2 is connected to an address pad 130(90) of FIG. 3 like 110(A, 12) of FIG. 1.

Likewise, both pin 110(A,12) of FIG. 1 and pin 110(A,1) of FIG. 2 also receive an external address A7 signal generated from the memory controller. However, the 110(A,12) of FIG. 1 is connected to an address pad 310(90) of FIG. 3 while the 110(A,1) of FIG. 2 is connected to an address pad 310(124) of FIG. 3 like 110(A,1) of FIG. 1.

Figure 4:
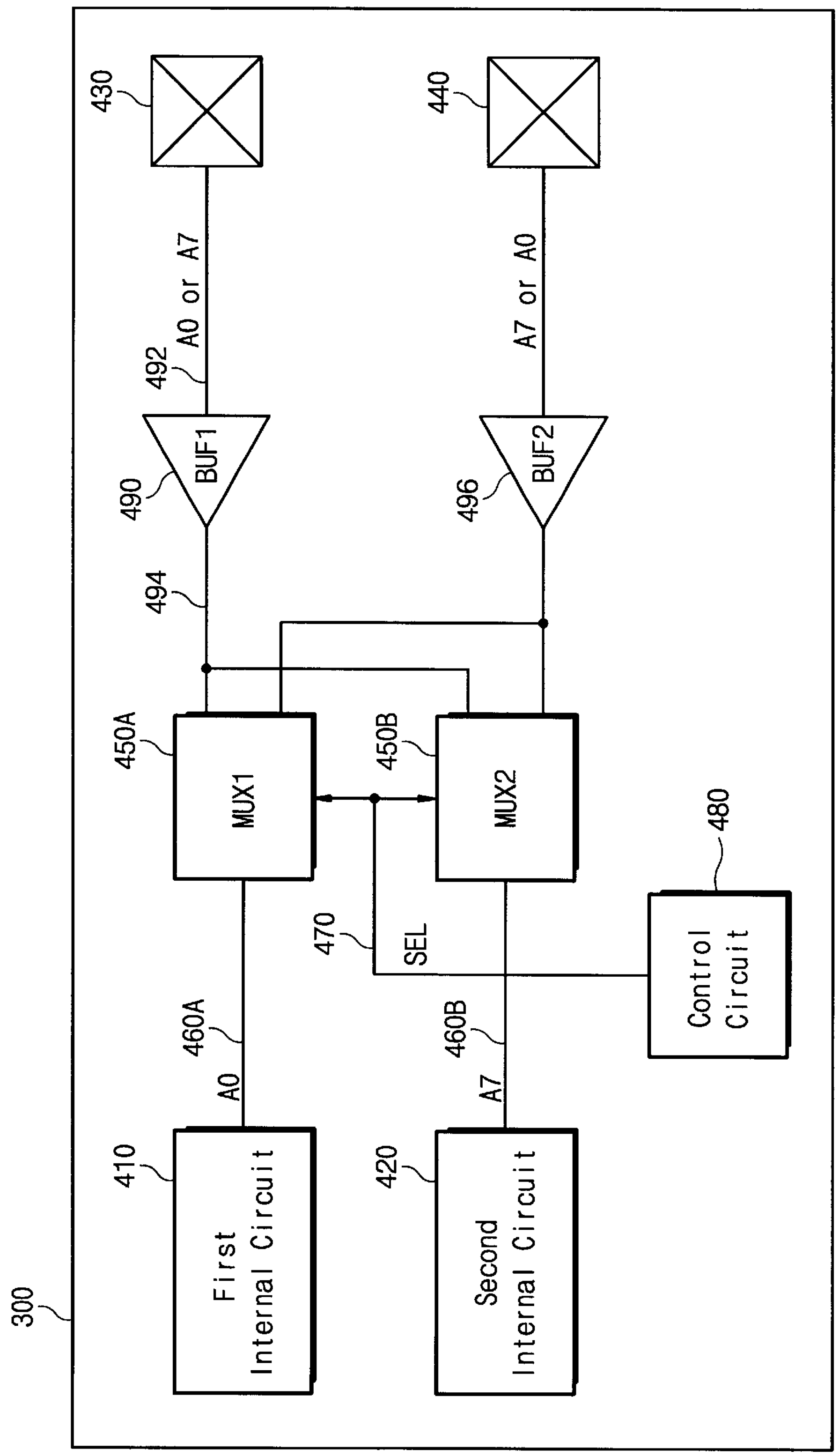
FIG. 4 is a schematic diagram of an integrated circuit device according to an embodiment of the present invention.

Even though the pin 110(A,1) of the FIG. 2 receiving an external address A7 signal is connected to the address pad 310(124) of FIG. 3, the external address A7 signal is transferred to an internal circuit for A7 address through the switching circuit (450) of FIG. 4 in response to SEL signal.

Figure 5A:
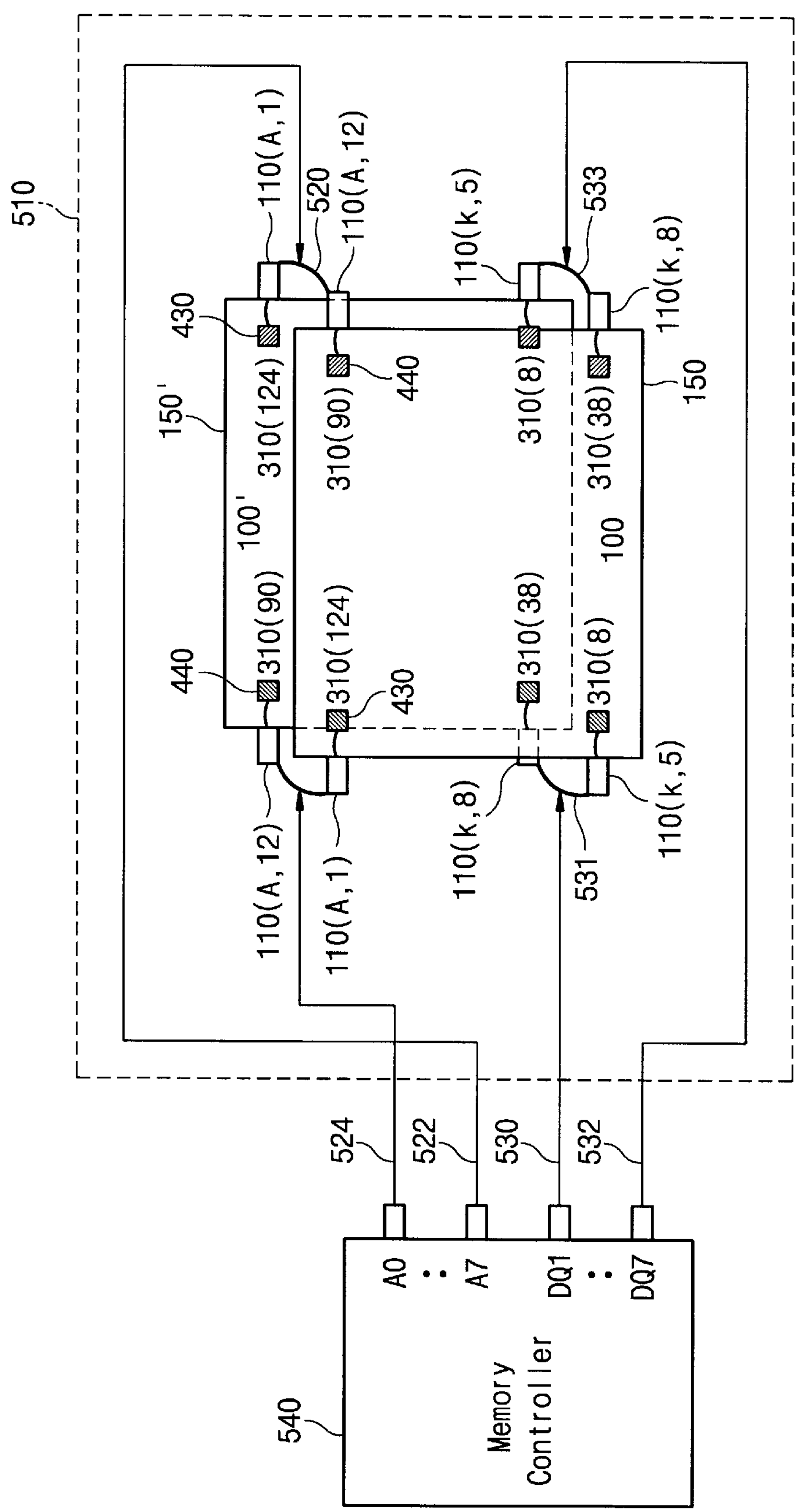
FIG. 5A is a schematic diagram of a signal system showing external signals to be applied to a package of a normal pin arrangement and also to another package of a mirrored pin arrangement.

The reason why the pin 110 (A,1) of FIG. 2 receives address A7 is that the pin 110(A,1) of FIG. 2 is located at the same position as the pin 110(A,12) of FIG. 1 when the normal pin configuration mounted a memory chip and mirror pin configuration mounted a memory chip are packaged as a chip package like FIG. 5*a*. Likewise, the reason why the pin 110(A,12) of FIG. 2 receives an external address A0 is that the pin 110(A,12) of FIG. 2 is located at the same position as the pin 110(A,1) of FIG. 1 when two kinds of pin configuration mounted a memory chip respectively are packaged as a chip package like FIG. 5*a*.

Likewise, data bits DQS3 and DQS0 may be assigned to respective pins 110(M,1) and 110(M,12) of the arrangement 100', which in turn mirror their alternative assignments in arrangement 100.

Thus, the pin-to-signal assignments to the arrangement 100' of FIG. 2 may be described as mirroring the pin-to-signal assignments of the normal arrangement 100 of FIG. 1. The descriptors "mirrored" and "normal" are terms of convenience. It is understood that the arrangement 100 of FIG. 1 might be referenced as mirroring the normal arrangement 100' of FIG. 2.

Further referencing FIGS. 1 and 2, mirror axis 120 may be represented across the integrated circuits 150 between the sixth and seventh columns of pins 110(6) and 110(7). About mirror axis 120, the pin-to-signal assignment of arrangement

100 (FIG. 1) mirrors that of arrangement 100' (FIG. 2). Additionally, it may be observed that the placement of the pads or pins 110 of integrated circuit 150 may physically mirror one another about axis 120. For example, the physical placement of pin 110(A,6) may mirror the physical placement of pin 110(A,7) about axis 120. And similarly, the pins of other mirrored pairs may physically mirror one another relative to axis 120.

In accordance with further embodiments, each pin of a mirrored pair may comprise similar signal types. Referencing FIG. 1, the pins of the pair 110(A,1&12) may be assigned to address signals—e.g., A0 and A7 respectively; the pins of pair 110(A, 5&8) may be assigned to control signals; the pins of pair 110(B,1&12) may be assigned to voltage signals VREF; and the pins of pair 110(C,1&12) may be assigned to data signals DQ23 and DQ8. Although, such similar signal assignments may be shown for this embodiment, other embodiments may not necessarily maintain similar signal type assignments (e.g., control signals, address signals, data signals, and voltage signals) to respective pins of the mirrored pairs.

In general, it may be observed that the use of integrated circuits of mirror image relationship can simplify the layout or routing of traces for a module board, which may be viewed as supporting and electrically interfacing the integrated circuits mounted thereon. Simplifying the layout of traces for the board may improve the integrity of its channels for signal propagation that may be used for channeling signals to various pins of the mirrored pairs.

Absent such mirror image relationships, the electrical interfacing to the pins of same identity for the different integrated circuits might, therefore, require different traces of different electrical lengths. For example, a trace (e.g., a conductive line on or within a circuit board) to interface a pin of an integrated circuit on one side of the board may not have the same length as that for a trace to a corresponding pin (of same signal assignment) of an integrated circuit mounted on the opposite side of the module. Such line length differences can degrade the integrity of a signal destined to each of the pins.

For example, an address signal may reach the closer pin of a first integrated circuit before reaching the same identity pin of the second opposing integrated circuit. Such differences in time of arrival may have an adverse impact to the overall memory module that may be trying to implement synchronous-type data transfers or processing applications.

Additionally, the trace of shorter length may produce reflections that may impact the quality of the signal that may also be destined to other integrated circuits. Likewise, the longer length line may present an undesirable impedance discontinuity where it meets a transmission line associated with routing the signal to the closer integrated circuit. Such discontinuity—e.g., such as where the two lines meet—likewise, can adversely affect the quality of the signal to be received (or transmitted) by the integrated circuits.

Various measures might be used to correct for the differences in signal delays. For example, an addition of an extra line-length might be incorporated with the shorter trace. But such extra length may demand more board space. Additionally, it may increase its vulnerability to external noise and, likewise, may allow signal transitions of the line to couple to other regions of the module or radiate outside the module. Packages of mirrored relationship may overcome some of these difficulties.

Referencing FIGS. 1 and 2, exemplary integrated circuits 100,100' of a mirrored pair may comprise same arrangements of pads 110(A–M, 1–12). Accordingly, the separate pins of opposing integrated circuits may be coupled to a same signal line of the module board at substantially the same locations on the board. This may avoid the need for different length traces on the board for routing a signal to same identity pins of opposing integrated circuits.

In accordance with exemplary embodiments of the present invention, switching circuitry within an integrated circuit may be selectably configurable to establish separate pad-to-signal assignments to pins of the integrated circuit. This ability to configure the same integrated circuit for different normal or mirrored pin-to-signal assignment may allow the integrated circuit devices to be fabricated by same process flows. Otherwise, the devices might require separate builds or process flows for respective normal and mirrored configurations.

Referencing FIG. 3, exemplary integrated circuit 300 (alternatively, substrate 300) of an intermediate level of fabrication may comprise pads 310 of an edge arrangement. The plurality of pads 310(1–166) may be disposed along (i.e., proximate) an edge or outline 320 of the substrate. Such configuration may be referenced as an "edge pad arrangement" or "edge pad structure." With further processing or fabrication, the substrate 300 may receive additional re-routing lines to couple its edge pads 310 to subsequently formed pins 110 of a ball grid array arrangement 100,100' of FIGS. 1 and 2 respectively.

Further referencing FIG. 3, in accordance with exemplary embodiments, internal circuitry of integrated circuit 300 may selectively and alternatively route two different signals between different bonding pads 310 of integrated circuit 300. The different boding pad 310 of substrate 300 may be associated with respective mirrored pads 110 of ball grid array configurations 100,100' (FIGS. 1–2). For example, an intermediate layer(s) (e.g., such as semiconductor materials, dielectric, metal, vias etc.) may form an interposer for establishing electrical links between a surface of integrated circuit 300 (such as that shown in FIG. 3) and pins 110 of ball grid array arrangements 100,100' of the integrated circuits 150,150' (FIGS. 1 and 2).

In a particular exemplary embodiment, referencing FIGS. 1–3, bonding pad 310(90) of integrated circuit 300 for an address signal A7 may be electrically coupled via an interposer layer (not shown) to pin 110(A,12) of the normal ball grid array package 100 to receive an external address A7. Similarly bonding pad 310(124) of integrated circuit 300 for an, address signal A0 may be coupled to pin 110(A,1) of the normal ball grid array package 100 to receive an external address A0.

For the mirrored configuration 100', on the other hand, the bonding pad 310(90) of integrated circuit 300 may be electrically coupled to pin 110(A,12) to receive an external address A0 along with the pin 110(A,1) of FIG. 1. And, bonding pad 310(124) of substrate 300 may be electrically coupled to pin 110(A,1) to receive an external address A7 along with the pin 110(A,12) of FIG. 1 Selectively configurable circuitry internal the integrated circuit, as will be described below, may determine the signal associations of these, e.g., bonding pads 310(90),310(124) and pins 110(A,12),10(A,1).

In a memory module application, the pins for data, power and ground, perhaps, may not need re-routing—i.e., between the mirrored and normal arrangements. For example, as shown in FIG. 1, a supply Vss may be assigned to pins of 110(D,5), 110(D,6), 110(D,7) and 110(D,8). Such signal assignments may remain the same for both the normal and mirrored arrangements. The same might be said for the data bits. Within memory devices, the exact column locations of respective data bits to a given word might not be of concern. Accordingly, the particular data bits of a data word, as assigned to the pins of a package or IC, might not be re-routed for the normal versus mirrored arrangements.

While data bits may not be mirrored for some embodiments; the exemplary embodiments of FIGS. 1 and 2 on the other hand, establish arrangements 100,100' with mirrored data bit assignments. Mirroring of the data bit assignments may be useful for enabling tight control of the timing relationships for data transfers—e.g., as may be helpful for certain high-speed or synchronous data transfer applications.

Address and control signals, in comparison to the data signals, will be routed to predetermined internal circuits within the integrated circuit. Without internal switching circuits to selectively configure these internal circuits to receive designated signals of a normal or, alternatively, a mirrored pin arrangement, unique interposer structures might have been provided to re-route signals from a chip pad layout to pins of a normal pin-out or, alternatively, to pins of a mirrored arrangement.

Exemplary disadvantageous of these interposer structures may include, e.g., the need for separate process/fabrication flows to produce the separate integrated circuits of the normal and mirrored interposer pin-out arrangements. For example, the normal configuration and mirrored configuration may comprise different interposers (not shown) to electrically interconnect the chip bonding pads to pins of either the normal or mirrored arrangement. But as the number of pins increase, the re-routing circuits of the interposers may become more complicated.

Additionally, the electrical characteristics of semiconductor devices, with such interposers may suffer as its frequency of operation (i.e., operating speed) increases. With increases in operating frequency, differences in I/O line lengths may become more pronounced. Accordingly, devices having an interposer for establishing a mirrored pin-to-signal arrangement might introduce signal delays to internal circuits that may be different from the delays to the internal circuits for a device of normal pin-to-signal arrangements. But for the present exemplary embodiments, internal switching circuits that may be included to establish the alternative signal assignments to the pins of an integrated circuit. Accordingly, the interposer circuits can be eliminated, thereby, also eliminating some of the interposer difficulties such as line length differences, signal cross-couplings and noise vulnerabilities.

However, as operating frequencies continue to increase, some of the same interposer-type considerations (line lengths, cross-couplings and noise vulnerabilities) may, again, need to be taken into account in order to maintain an operability of the integrated circuits and memory modules over a wide range of operating frequencies.

Internal I/O lines of an integrated circuit may influence the integrity of signals and signal propagation therein. To reach an internal circuit of an integrated circuit, a signal may propagate, e.g., an I/O interface, a first path from the I/O interface to a switching circuit, through the switching circuit and along another path from the switching circuit to the internal circuit. But just as a difference in electrical lengths between interposers or board layout may influence the integrity of a signal destined to internal circuits of normal and mirrored integrated devices, so too may differences in internal paths of the integrated circuits also affect signal integrity. Such differences may introduce some problems—such as, e.g., variance in signal slew rates, miscorrelation of signal transitions, inconsistent reflection characteristics, discontinuities in impedance, propagation losses or unpredictable R/C delays.

In accordance with an exemplary embodiment, with reference to FIG. 4, first and second internal circuits 410,420 of an integrated circuit 150 may receive signals of pads 430,440 or visa versa 440,430, respectively, dependent on the selected state of switching circuit 450. In this embodiment, switching circuit may comprise multiplexers 450A and 450B. Multiplexer 450A may couple input 460A of the first internal circuit 410 to receive a signal of either pad 430 or pad 440 dependent on a control signal of control line 470. Similarly (but complimentary to multiplexer 450A), multiplexer 450B may couple input 460B of second internal circuit 420 to receive a signal of either pad 440 or pad 430 dependent on the control signal of line 470. Control circuit 480 may generate the control signal for setting the configurations of multiplexers 450A, 450B.

Further referencing FIG. 4, buffers 490,496 may be disposed electrically in series with the signal paths between the switching circuit 450 and pads 430,440 respectively. In accordance with one aspect of an exemplary embodiment, the buffers may be positioned proximate to the I/O pads 430,440. For example, the length of transmission line 492 between pad 430 and associated buffer 490 may be less than several μm. The length of the transmission line 494 between the buffer and the switching circuit 450, on the other hand, may be greater than several μm. For exemplary embodiments, the buffers may be positioned electrically closer to the pads than to respective switching circuits. In the illustrated embodiment, buffer 496 may be position closer to pad 440 than to switching circuit 450.

In a further exemplary embodiment, the pads 430,440 may mirror each other within an arrangement of a ball grid array (e.g., pads 110 of FIGS. 1–2). In other embodiments, they may be disposed along an edge of a substrate of an edge pad arrangement (e.g., pads 310 of FIG. 3). Additionally, an interposer may couple the edge pads to mirrored pins of a ball grid array package. In further embodiments, the edge pads may mirror one another about a mirror axis over the substrate.

For a package of a normal arrangement, for example, multiplexer 450A may be configured to couple the signal of pad 430 as buffered by buffer 490 to be routed to the first internal circuit 410. Additionally, multiplexer 450B may be configured to couple the signal of pad 440 as buffered by buffer 496 to the second internal circuit 420.

For establishing a mirrored arrangement, control circuit 480 may provide a different control signal to line 470 and multiplexers 450A, 450B may be reconfigured for the alternative configurations. Multiplexer 450A may route the signal of pad 430 to the second internal circuit 420 and multiplexer 450B may route the signal of pad 440 to the first internal circuit 410.

In a further embodiment, buffers 490,496 comprise voltage converters. Each may receive TTL levels from a source external the integrated circuit. The buffers may convert the TTL level signals to CMOS levels that may drive the internal circuits of the integrated circuit. When receiving the signal form an external source, the signal may comprise a low level voltage that may need buffering for used on-board the integrated circuit.

Additionally, a I/O signal path—e.g., 492 and 494–460A (or 494–460B)—from the pad to the internal circuitry 410 (420) may cross or extend in close proximity to other circuits of the integrated circuit. These other circuits may provide signal transitions that may influence (by capacitive or inductive couplings) signals of the I/O path. Such "noise" cross-couplings to the I/O path may degrade signals destined for the internal circuit(s). On the other hand, by buffering the signal paths proximate the I/O pads, the buffers may provide greater drive capability with levels more effective for propagation on-board the integrated circuit. Additionally, the buffered signals may be less vulnerable to noise cross-couplings or influences from neighboring circuits.

The buffers may also provide reverse isolation. Signals internal to the integrated circuit (e.g., which may be of high levels relative to the lower levels outside the integrated circuit) may, therefore, be kept within the integrated circuit. Absent such buffers, the internal signals that might be coupled onto the lines may propagate outwardly along the lines to circuits external the integrated circuit. The buffers of the signal paths, on the other hand, may provide reverse isolation for attenuating the outward propagation of such (noise) signals along the paths.

In the above exemplary embodiment, the buffers were described as buffering signals from the I/O pads (e.g., 430,440) to be forwarded to the internal circuits of the integrated circuit. It will be understood, however, that the scope of the present invention encompasses other buffer orientations. For example, the buffers might be oriented to receive signals of the internal circuits and for outward propagation outwardly to the I/O pads and external the integrated circuit. In such cases, the buffer may convert the signal of the internal levels (e.g., CMOS) to an external level (e.g., TTL). Additionally, the buffer in this configuration may similarly provide reverse isolation to prevent (noise) signals that may be external the integrated circuit from propagating along the I/O signal path and into the integrated circuit.

Further referencing FIGS. 1, 2, 4 and 5A–5C, semiconductor devices or integrated circuits 150,150' of normal and mirrored pin-to-signal arrangements 100,100' may be mounted on opposite sides of a board 510. In this embodiment, mirrored pins (e.g., 110(K,5) and 110(K,8)) of the respective integrated circuits 150,150' face each other and may be coupled together by the board.

For example, board 510 may have mounting pads (e.g., 560,562 FIGS. 5B, 5C) to electrically interface pins 110 of the integrated circuits 150,150'. Conductive lines, e.g., 522, 524,530,532, may channel different signals to respective same identified pins of the normal and mirrored configurations 100,100'. For instance, signal DQ1 may originate from a memory controller 540 as shown in FIG. 5A. Board 510 may propagate the signal DQ1 along conductive trace 530 to pins 110(K,5) and 110(K,8) of the integrated circuits of normal and mirrored configurations 100,100' respectively. In certain exemplary embodiments, referencing FIG. 5B, mounting pads 560,562 of the board interface respective mirrored pins 110 of the integrated circuits of the mirrored pair. The mounding pads 560,562 may be coupled together by conductive material that extends through the module board at a location proximate the opposing pins. In some embodiments, the opposing mounting pads 560,562 of the mirrored pins may be coupled to one another by a blind via 531 that passes through the board between the mounting pads.

Figure 5B:
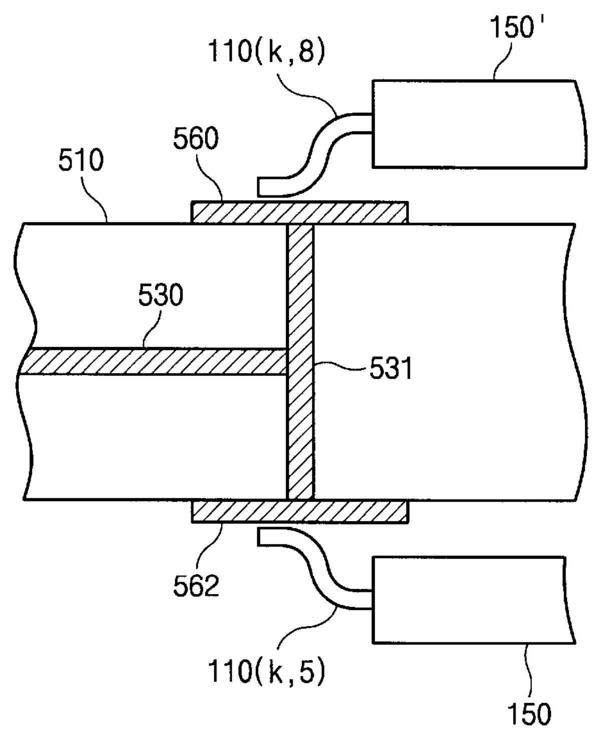
FIGS. 5B and 5C are partial cross-sectional views of a module board showing opposing integrated circuits of a mirrored pair.
Figure 5C:
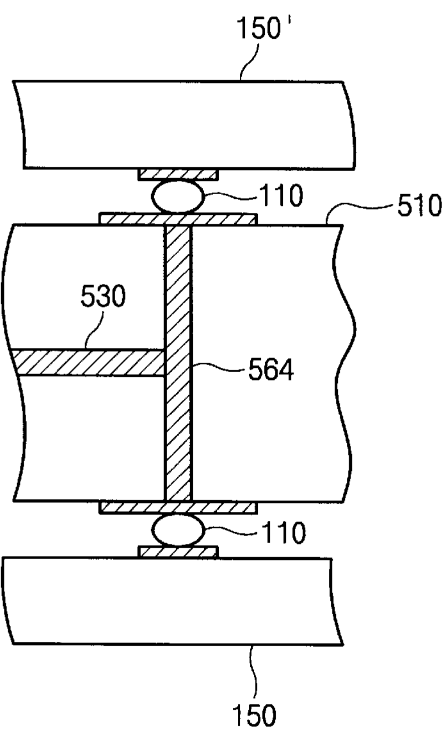

FIG. 5C shows a similar blind via 564 to couple pads of the module board. These pads may couple to pins of a ball grid array package. In the exemplary illustrations, pin annotations 110(K,8) and 110(K,5) may be maintained merely for convenience to represent these pins of the gull-wing package in FIG. 5B to be associated with signals DQ1 of 100 and DQ1 of 100' as previously described relative to FIGS. 1–2. The DQ1(k,5) of 100 is connected to DQ1 pad 310(8) of FIG. 3 while the DQ1 (k,8) of 100' is connected to DQ30 pad 310(38) of FIG. 3, like DQ30(k,8) of FIG. 1.

With such assemblies to the board, further referencing FIGS. 5A–5C, the mirrored pins of the respective normal and mirror arrangements 100,100' may be electrically connected to each other to receive the same signal of a given source—e.g., a memory controller 540 or other chip set—at substantially the same locations. Further, the propagation distance of the respective signal paths to the normal and mirrored arrangements 100,100' may be kept substantially the same. In this embodiment, a minor difference may be present between the two paths as may be attributed to the different parts of the blind via, the different parts between the connection of trace 530 and respective pads 560,562 as shown in FIG. 5B. In one exemplary embodiment, the interlayer trace 530 within the circuit board (e.g., laminated layers) may join via 531 near its center position between the opposing mounting pads 560,562.

To configure the "normal" or "mirrored" arrangements for the integrated circuits of the mirrored pair 150,150' as shown in FIGS. 5A–5C, control circuits 480 (FIG. 4) of the respective devices may be programmed for establishing normal and mirrored control signals. Control circuit 480 of integrated circuit 150 may be programmed to generate a normal control signal. This normal control signal on line 470 may selectably drive multiplexer 450A to configure a signal path between input 460A of internal circuit 410 and pin 430. Multiplexer 450B may configure a second signal path between input 460B of internal circuit 420 and pin 440.

In contrast, the control circuit of the opposing integrated circuit may be programmed to establish a signal-to-pin assignment of a mirrored arrangement 100'. With a mirrored control signal on line 470, multiplexer 450A may configure a signal path between input 460A of internal circuit 410 and pin 440; and multiplexer 450B may configure a signal path between input 460B of internal circuit 420 and pin 430.

Figure 6:
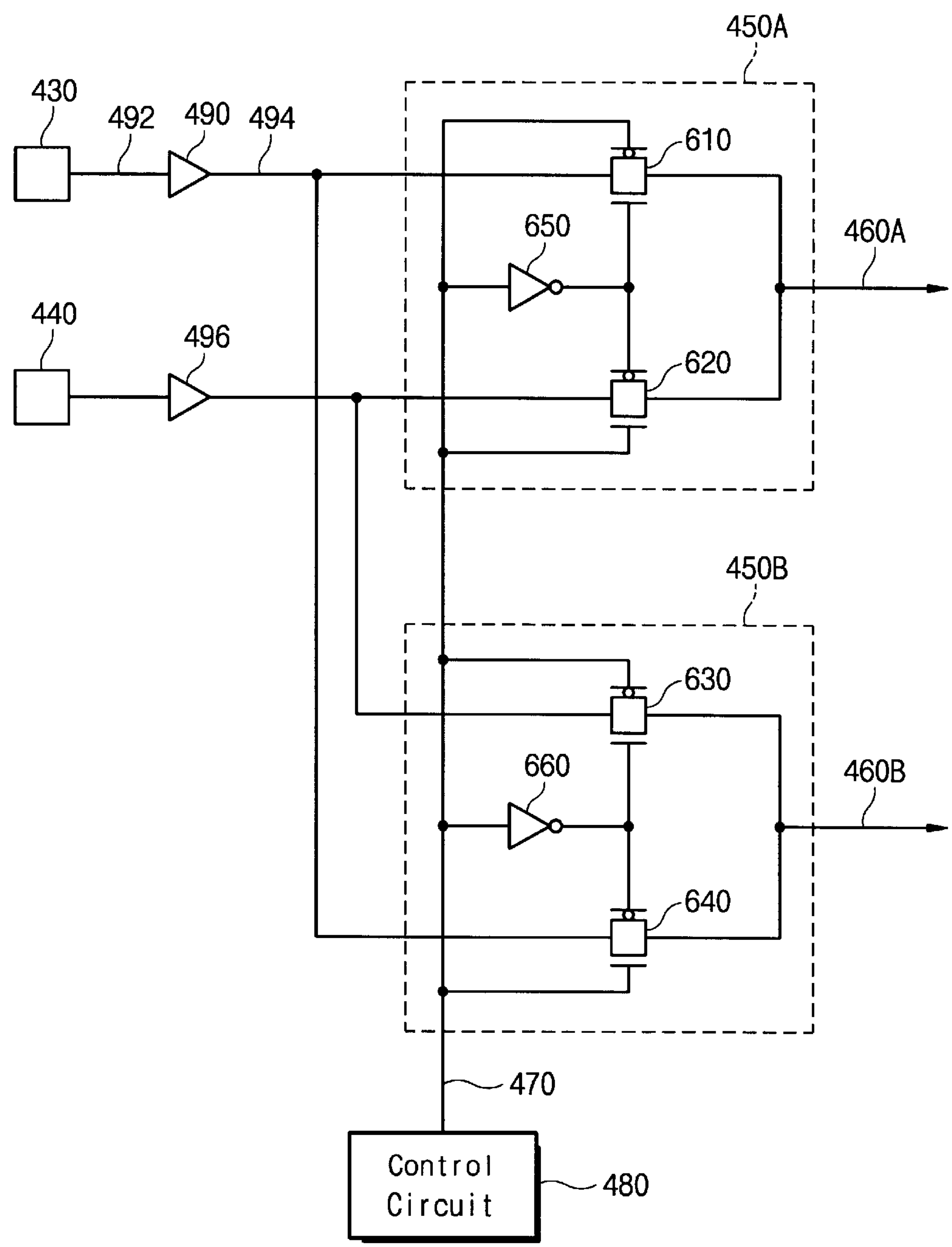
FIG. 6 is a schematic diagram illustrating a multiplexer for an exemplary embodiment such as that as shown in FIG. 4.

Further referencing FIG. 6, each of multiplexers 450A, 450B may comprise two transfer gates and an inverter. For example, multiplexer 450A may comprise transfer gates 610,620 of a 2:1 multiplexer configuration. Transfer gate 610 may be disposed with its gateable channel in series between node 460A to the input of a first internal circuit 410 (as shown in FIG. 4) and node 494 as may be associated with the output of buffer 490. On the other hand, transfer gate 620 may be disposed with its channel in series with the signal path between node 460A and buffer 496. The p-channel of passgate 610 receives the control signal directly and the n-channel by way of inverter 650. Similarly, the control signal of line 470 may drive transfer gate 620, but in complimentary fashion. The n-channel of transfer gate 620 may receive the control signal directly and the p-channel by way of inverter 650.

Similarly, multiplexer 450B may comprise two transfer gates 630,640 and inverter 660 for establishing a 1:2 selection between output 460B and two inputs—one input from buffer 490 and the other from buffer 496 respectively. Transfer gate 630 may be disposed serially between node 460B and buffer 496; while transfer gate 640 may be disposed serially between node 460B and buffer 490. The p- and n-channels of the respective transfer gates 630,640 may be driven by the control signal of line 470 as similarly described above for transfer gates 610,620.

In this embodiment, further referencing FIG. 6, a high control signal may establish a first signal path between I/O pad 440 to internal node 460A and a second signal path between I/O pad 430 and internal node 460B. Alternatively, a low control signal may establish a first signal path between I/O pad 430 and internal node 460A; and a second signal path between I/O pad 440 and internal node 460B.

Figure 7A:
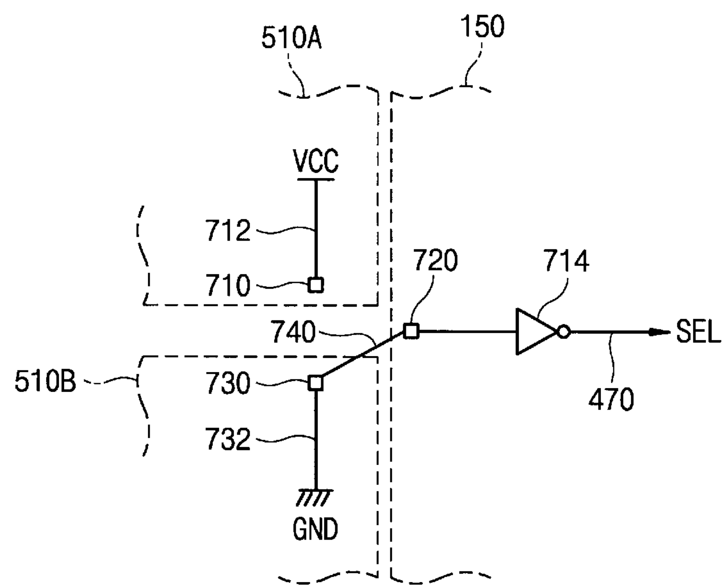
FIGS. 7A to 7C illustrate exemplary embodiments of control circuits to establish a select signal for driving the multiplexers of FIG. 4.
Figure 7B:
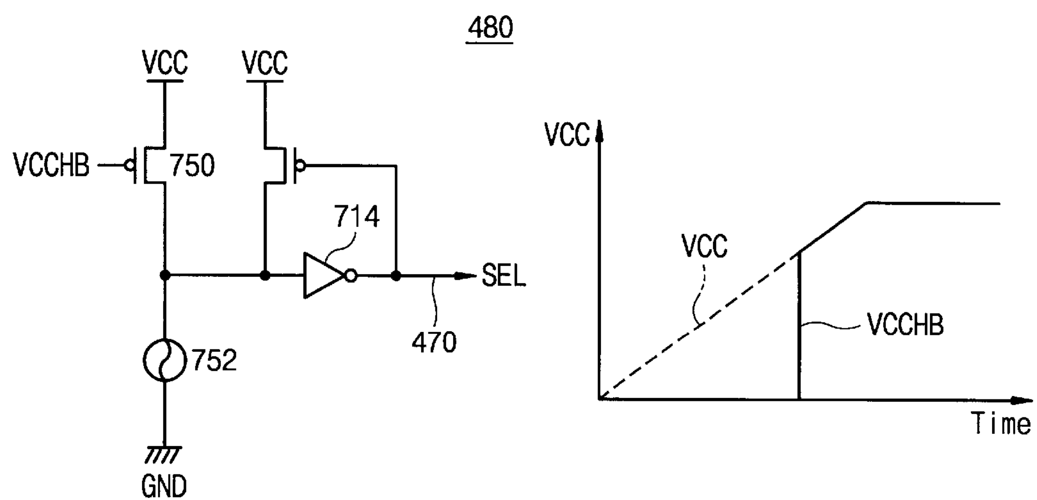
Figure 7C:
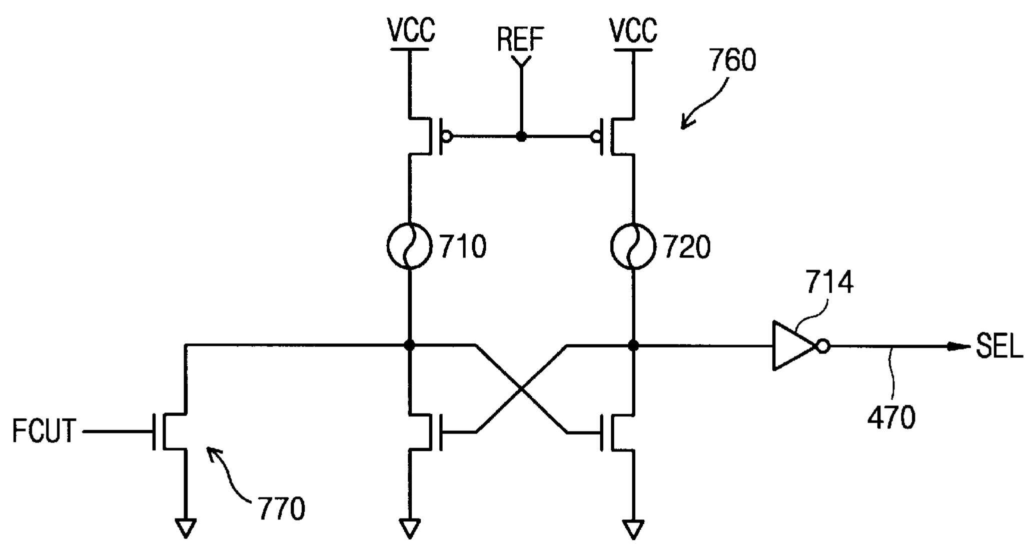

Referencing FIGS. 7A–7C, in accordance with further embodiments, control circuit 480 (see FIG. 4) comprises a programmable element to establish a control signal for selectably configuring the switching circuits (e.g., multiplexers 450). Such programmable element(s) may be programmable at a wafer level, package level, module level or a combination thereof. For example, the programmable element may comprise a bond wire, a fuse, option circuit, latch, flash cell or the like.

Referencing FIG. 7A, electrical interconnect 740 may comprise a wire bond to establish a control signal (for select line 470) based upon its select bond out location. If the bond wire is attached to the upper supply of bond pad 710, the control signal may become low via inverter 714. Alternatively, if bonded to the alternative supply level, e.g., ground bond pad 730, then the control signal may become high via inverter 714.

Further referencing FIG. 7A, in another embodiment, electrical interconnect 740 may comprise an alternative electrical interconnect, e.g., such as a solder connection. Integrated circuit 150 (as represented by dashed lines in FIG. 7A) may comprise pin 720 to meet an interfacing pad 730 on one side of module 510B. Interfacing pad 730 may receive a low level bias such as ground. On the other hand, when the integrated circuit is mounted on the other side of memory module 510A, the same pin 720 may couple to a different pad 710 to receive an alternative bias such as Vcc. In such embodiment, the arrangement of the integrated circuit (i.e., normal or mirrored) may depend on which side of the module board that the integrated circuit is mounted. On one side of the module board 510A, a conductive trace 712 of the board may receive a first level bias. On the other side of the module board 510B, an alternative conductive trace 732 may source a different bias.

Referencing FIG. 7B, alternative control circuit 480 may comprise PMOSFET 750 having a gateable channel disposed in series with fuse element 752. Fuse 752 may be coupled to ground and the source of PMOSFET 750 coupled to a supply node VCC. The drain node of MOSFET 750, which is coupled to fuse 752, may also be coupled to an input of a latching circuit. The latching circuit may be operable to latch a condition of a signal generated by fuse element 752 and MOSFET 750. The latching circuit may drive output node 470 with a select signal SEL as established by programmable fuse 752.

As shown in FIG. 7B, the latching circuit may comprise inverter 714 in combination with a feedback MOSFET such as a PMOSFET device. When the control circuit 580 initially receives a power signal VCC, the gate of PMOSFET 750 may receive a delayed representation of the VCC supply signal. As shown by the graph representative of the operation of the control circuit, as VCC (represented by the dashed line) ramps-up, the gate's control signal VCCHB may initially remain low. If the fuse has not been blown, the input level to the latch may remain low and the latch may latch the low input level and may output control signal SEL with a high level. This in-turn may disable the PMOSFET feedback transistor of the latch.

After a brief delay following the VCC ramp-up, control signal VCCHB at the gate of PMOSFET 750 assumes the same level as the supply voltage VCC. The PMOSFET 750 may then be disabled to prevent further current flow in the leg associated with fuse 752. Alternatively, if the fuse has been previously programmed for an open condition, it may be seen that the latching circuit may latch a high level input signal and output control signal SEL with a low level.

In other embodiments, the control circuit comprises a programmable element that may be set at the wafer level, packaged level or thereafter. For example, the control circuit may comprise an electrically programmable fuse circuit. Referencing FIG. 7C, a latching circuit 760 may be combined with an electrical element 770 receiving the fuse cutting enable signal (FCUT). In this embodiment, MOSFET 770 may be enabled to burn (blow) an electrical fuse (710) in one of the arms of latching circuit 760. Basically, the resistive value (R1) of the fuse (710) is greater than that (R2) of fuse (720). Thus, if the fuse (710) is cut, the control signal (SEL) is low level while if the fuse (710) is not cut, the control signal (SEL) keeps high level. Returning to reference FIGS. 4 and 5A–5C, opposing integrated circuits of a mirror pair 150,150' may have same identity pins opposing one another on opposite sides of module board 510. Internal the integrated circuits, respective I/O signal paths of the different pins may comprise buffers in series therewith.

For some of the embodiments, therefore, similar buffers and similar line lengths between the pins and buffers may be formed for a plurality of I/O terminals of the integrated circuits. For such exemplary embodiments, it may be noted that the integrated circuits may comprise substantially consistent electrical characteristics across the plurality of I/O signal paths.

In further exemplary embodiments, the normal and mirrored integrated circuits may comprise similar termination characteristics and propagations delays relative to the external sources (or destinations). Additionally, the electrical line lengths may be substantially the same along both the normal and mirrored signal paths to respective buffers. Further, the operating characteristics may be more consistent across the plurality and over a broader range of operating frequencies.

In may be further noted that for certain exemplary embodiments, the same fabrication flows may be used for both the devices of normal and mirrored arrangements.

In the exemplary embodiments where the buffers are disposed proximate the I/O pins of the integrated circuit, controlled termination impedances may be presented to the I/O interfaces. This might then avoid undue RC parasitic influences of the, otherwise, longer signal paths. Such exemplary embodiments, therefore, may allow tight control of the setup and hold times over a range of different operating frequencies.

In some of the above descriptions, exemplary embodiments may have been shown in simplified form with buffers and I/O pads associated with two signals of a single mirrored pair. It is understood, however, that the scope of the present invention may extend to multiple such mirrored pairs. For example, referencing FIG. 8, two integrated circuits 850, 850' include a plurality 110(B) of I/O pads of normal and mirrored respective pin-to-signal arrangements. The I/O pads 804,806,808,810,812,814,816,818 of integrated circuit 850 correspond to the pins of row B as shown in FIG. 1 for the normal pin-to-signal assignments 100 of integrated circuit 150. In mirrored relationship, the same pins 804–818 may be viewed as corresponding to a same row of pins B of the ball-grid-array of an integrated circuit 150' of mirrored pin-to-signal assignment 100' as shown in FIG. 2.

Figure 8:
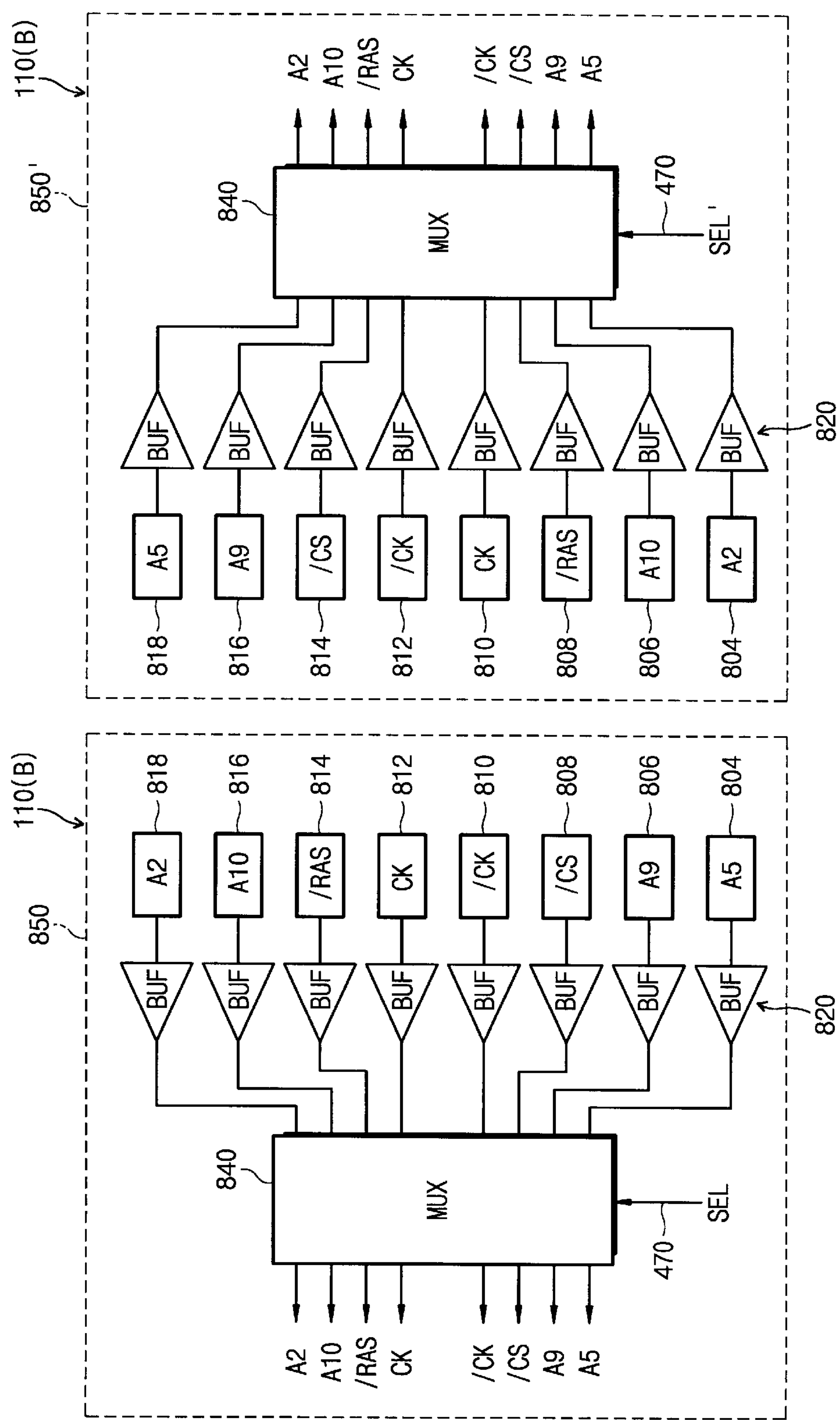
FIG. 8 is a schematic diagram of a routing structure which uses a package of a mirrored pin arrangement according to an embodiment of the present invention.

The examples of FIG. 8 show pads to a single row, e.g., of a ball-grid-array. It is understood, however, that the scope of the present invention will encompass similar circuits for other rows of a ball-grid-array. Additionally, the scope of the present invention may include other sets of signals for such row or rows of the plurality; and may also include other number(s) of pins per row.

Further referencing FIGS. 8, it may be noted that not only do the signal assignments mirror one another in a pair, but that their physical placements may also mirror each other. Further, the signal types may be the same—i.e., pins of a mirrored pair may be designated to carry same type of address, data, control or bias signals. And for those of same type signals, complimentary relationships may also be assigned to the respective pins of a mirrored pair. In this example of FIG. 8, signals A2, A10, /RAS, CK, /CK, /CS, A9, A5 may be assigned to pads 804–818 of the mirrored device 850'. The normal device 850, on the other hand, may have the signals A5 A9, /CS, CK, /RAS, A10, A2 assigned to respective pads 804–818. Similarly as described before relative to FIGS. 4 and 6, multiplexers 840 of the normal and mirrored devices 850,850' establish—in accordance with control signals SEL,SEL' of control line 470—the appropriate switching configurations for the transfer of signals between the I/O pads and their assigned internal circuits.

Buffers 820 may be disposed between the signal connections to multiplexer 840 and respective signal I/O pads 804–818. The buffers may convert signals of the I/O pads to different logic levels. For example, the buffers may convert external TTL-level signals into CMOS-level signals for use by internal circuits. The converted signal may then be transferred (via the multiplexer 470) to its originally assigned internal circuit.

With similar types of signals associated with the pins of mirrored pairs, the buffers to the pins of a mirrored pair may be designed for signal conversions unique to such pins of a first pair relative to the pins of a second pair. For example, the address pins may drive logic decoders with logic levels that may be different than, perhaps, the levels needed for driving the data circuits. Therefore, buffers associated with the address pair may be designed differently from those of a data pair.

In FIG. 8, circuitry to generate the select signal of line 470 may correspond to the control circuitry previously described with reference to FIGS. 7A–7C.

Figure 9:
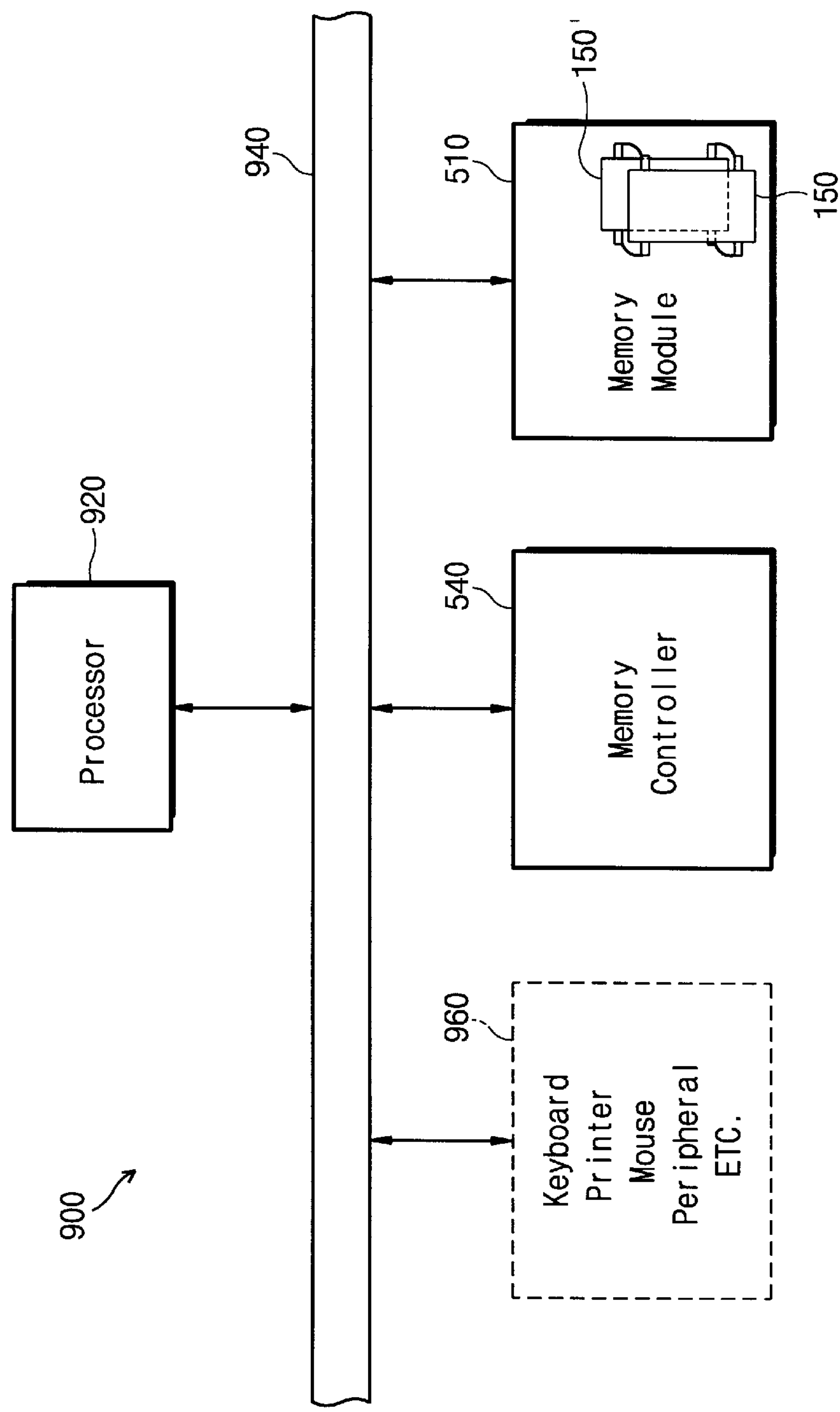
FIG. 9 is a schematic diagram of an exemplary embodiment of the present invention showing integrated circuits of a mirrored pair with bonding pads and signal assignments such as those of row B in FIGS. 1 and 2.

Referencing FIG. 9, in accordance with a further exemplary embodiment, a data processor system 900 comprises processor 920 coupled to bus 940. Bus 940 may be coupled to sub-systems 960 such as, e.g., a keyboard, mouse, monitor, printer, network interface, disk system and the like. Additionally, bus 940 may interface memory module 510 directly or via memory controller 540. When interfaced by the controller, memory module 510 may be operable under the control of the controller.

As illustrated by the exploded view of FIG. 9, an exemplary memory module may comprise a mirrored pair of integrated circuits 150,150' of exemplary embodiments described earlier herein, e.g., relative to FIGS. 4–8. Traces within the module board may electrically interface the integrated circuit to—e.g., controller 540 or bus 940. The traces may propagate signals between the bus (or controller) and same identity pins of the mirrored integrated circuits.

In this embodiment, I/O buffers may interface the pins and may be configured to transfer signals between the pins and designated internal circuits of the integrated circuit. Switching circuits (e.g., multiplexers) may establish the configurations of the signal paths between the I/O pins and respective internal circuits based upon control signals of the integrated circuits. The control signals may designate mirrored or normal configurations.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. An integrated circuit comprising:

a substrate;

circuitry integrated with the substrate, the circuitry comprising:

at least first and second nodes;

first and second pads over the substrate; and a switching circuit selectable to configure first and second signal paths of respective first and second pads, the first signal path between the first pad and one of the first and second nodes and the second signal path between the second pad and the other one of the first and second nodes, the switching circuit selection to depend on a select signal having first level when the integrated circuit is mounted to a first surface of a board and having second level when the integrated circuit is mounted to an opposite surface of the board.

2. An integrated circuit according to claim 1, further comprising:

a buffer disposed between the switching circuit and at least one of the first and second pads.

3. An integrated circuit according to claim 2, further comprising:

an electrical line between the buffer and its associated pad; and an electrical line between the buffer and the switching circuit;

the electrical line between the buffer and pad shorter than the other.

4. An integrated circuit according to claim 3, in which the buffer comprises a signal converter.

5. An integrated circuit according to claim 4, the buffer to convert signals between TTL and CMOS levels.

6. An integrated circuit according to claim 1, further comprising:

a plurality of pins disposed over the substrate and defining a ball grid array;

at least two of the pins coupled to the respective first and second pads and of mirrored relationship within the ball grid array.

7. An integrated circuit according to claim 1, further comprising a control circuit to establish the select signal for configuring the switching circuit.

8. An integrated circuit according to claim 7, in which the control circuit comprises another pad to receive an external signal.

9. An integrated circuit according to claim 1, further comprising a programmable element to generate the select signal based on a program state of the programmable element.

10. An integrated circuit comprising:

a substrate;

circuitry integrated on the substrate; and a plurality pins disposed over the substrate and defining a ball grid array;

the circuitry comprising:

first and second nodes;

a first multiplexer to selectively configure, dependent on a select signal, a signal path between one node of the first and the second nodes and a first pin of the plurality of pins; and a second multiplexer to selectively configure, dependent on the select signal, a signal path between the other node of the first and the second nodes and a second pin of the plurality of pins;

the first and the second pins of mirrored relationship about an axis of the ball grid array; and the signal path between the first multiplexer and the first pin comprising a buffer.

11. An integrated circuit according to claim 10, in which an electrical length between the multiplexer and buffer is longer than an electrical length between the buffer and pin.

12. An integrated circuit according to claim 10, further comprising a second buffer as part of the signal path between the second multiplexer and the second pin.

13. An integrated circuit according to claim 10, further comprising a control circuit to establish the select signal to configure the multiplexer selections.

14. An integrated circuit according to claim 10, further comprising a programmable element to generate the select signal based on a program state of the programmable element.

15. An integrated circuit according to claim 14, in which the programmable element comprises at least one of a fuse, bond wire, option circuit, latch and flash cell.

16. A semiconductor device comprising:

a board comprising first and second sides, the sides opposite one another;

a memory integrated circuit disposed on the first side of the board; and another memory integrated circuit disposed on the second side of the board;

at least one of the memory integrated circuits comprising:

a semiconductor chip comprising internal nodes and I/O terminals;

a multiplexer selectably operable to establish a first signal path between a first I/O terminal and one node of first and second nodes of the internal nodes dependent on a select signal;

another multiplexer selectably operable to establish a second signal path between a second I/O terminal and the other node of the first and second nodes dependent on the select signal;

the first and second I/O terminals of mirrored relationship relative to an axis across the semiconductor chip; and a buffer between the multiplexer and the first I/O terminal.

17. A semiconductor device according to claim 16, the buffer to convert signals of TTL levels to signals of CMOS levels.

18. A semiconductor device according to claim 17, the buffer to convert signals of CMOS levels to signals of TTL levels.

19. A semiconductor device according to claim 16, the buffer comprising a termination impedance to substantially match that of a signal path between the buffer and the first I/O terminal.

20. A semiconductor device according to claim 16, in which the I/O terminals comprise pins of a ball grid array;

the first and second I/O terminals are electrically coupled to respective first and second pins of the ball grid array; and the first pin is positioned to mirror that of the second pin about a mirror axis of the ball grid array.

21. A semiconductor device according to claim 16, further comprising a control circuit to generate the select signal.

22. A semiconductor device according to claim 21, the control circuit comprising a programmable element.

23. A semiconductor device according to claim 21, further comprising:

a dedicated I/O terminal of the semiconductor chip;

a trace on one side of the board to interface the dedicated I/O terminal of such semiconductor chip to a first bias source; and a trace on the other side of the board to interface the dedicated I/O terminal of such semiconductor chip to a second bias source different from the first;

the dedicated I/O of the semiconductor chip to receive one of the first or the second bias dependent on which side of the board that the memory integrated circuit is mounted.

24. A semiconductor device according to claim 16, in which the board comprises a plurality of lines of a data base; and at least one of the first and second I/O terminals electrically interface a line of the data bus of the board.

25. A semiconductor device comprising:

a board comprising first and second sides, the opposite one another;

a first memory integrated circuit disposed on the first side of the board; and a second memory integrated circuit disposed on the second side of the board;

the first memory integrated circuits comprising:

a semiconductor chip comprising internal nodes and I/O terminals;

a first multiplexer selectably operable to establish a first signal path between a first I/O terminal and a first node of the internal nodes dependent on first level of a select signal; and a second multiplexer selectably operable to establish a second signal path between a second I/O terminal and a second node of the internal nodes dependent on the first level of the select signal;

the second memory integrated circuits comprising:

a semiconductor chip comprising internal nodes and I/O terminals;

a first multiplexer selectably operable to establish a first signal path between a second I/O terminal and a first node of the internal nodes dependent on second level of a select signal; and a second multiplexer selectably operatable to establish a second signal path between a first I/O terminal and a second node dependent on the second level of the select signal.

26. A semiconductor device package by either one of a first package and a second package, external electrodes of the first package are in mirror symmetry with those of the second package, the semiconductor device comprising:

a plurality of bonding pads connected respectively to corresponding external electrodes of either one of the first and second packages, the bonding pads supplied with corresponding TTL-level external signals through the corresponding external electrodes respectively;

a plurality of input buffer circuits each connected to respective bonding pads of the plurality, to receive the TTL-level external signals and to output CMOS-level internal signals corresponding thereto; and a multiplexing circuit to receive output signals of the input buffer circuits and to switch received signals in response to a control signal;

a control circuit to generate the control signal dependent on whether the semiconductor device is packaged by the first package or by the second package, wherein the multiplexing circuit switches the output signals of the input buffer circuits so that normal signals each applied to the bonding pads, when the semiconductor device is packaged by the first package, are transferred to corresponding internal circuits and so that mirrored signals each applied to the bonding pads, when the semiconductor device is packaged by the second package, are transferred to the internal circuits corresponding to the normal signals.

27. The semiconductor device according to claim 26, wherein signals to be input through the external electrodes of the first package are in mirror symmetry with those of the second package.

28. The semiconductor device according to claim 26, wherein each of the first and second packages is a fine-pitch ball grid array (FBGA) package.

29. A data processing system comprising:

a processor;

a memory module;

a data bus interfacing the processor and memory module;

the memory module comprising:

a board comprising a plurality of traces electrically coupled to the data bus;

a pair of mirror image memory chips opposing each other on opposite sides of the board;

at least one of the memory chips comprising:

first and second I/O terminals of mirrored relationship about an axis of the memory chip;

a first multiplexer operable, dependent on a select signal, to selectively route a first signal path between the first I/O terminal and one node of first and second internal nodes of the memory chip;

a second multiplexer operable, dependent on a select signal, to selectively route a second signal path between the second I/O terminal and the other node of the first and second internal nodes of the memory chip; and a buffer between the first I/O terminal and the first multiplexer.

30. A data processing system according to claim 29, the buffer comprising a signal converter for converting TTL/CMOS levels to CMOS/TTL levels.

31. A data processing system according to claim 29, the buffer comprises an input impedance to substantially match that of a transmission line between the buffer and first I/O terminal.

* * * * *

UNITED STATES PATENT AND TRADEMARK OFFICE

CERTIFICATE OF CORRECTION

PATENT NO. : 6,667,895 B2
DATED : December 23, 2003
INVENTOR(S) : Jang et al.

It is certified that error appears in the above-identified patent and that said Letters Patent is hereby corrected as shown below:

Title page,
Item [56], References Cited, OTHER PUBLICATIONS, should read
-- English language abstract for Japanese Patent No. 2000-340737 --.

Column 6,
Line 57, "FIG. 1 Selectively" should read -- FIG. 1. Selectively --.
Line 61, "110(A,12),10(A,1)." should read -- 110(A,12),110(A,1). --.

Column 10,
Line 6, "FIGS. 5A-5C, the" should read -- FIGS. 5A, 5B, and 5C, the --.

Column 13,
Line 17, "/CS, CK, /RAS," should read -- /CS, /CK, CK, /RAS, --.

Signed and Sealed this

Sixth Day of July, 2004

JON W. DUDAS
*Acting Director of the United States Patent and Trademark Office*